United States Patent [19]

Park

[11] Patent Number: 5,787,038
[45] Date of Patent: Jul. 28, 1998

[54] FLASH MEMORY DEVICE

[75] Inventor: Jae Kwan Park, Seoul, Rep. of Korea

[73] Assignee: Hyundai Electronics Industries Co., Ltd., Kyungki-do, Rep. of Korea

[21] Appl. No.: 730,872

[22] Filed: Oct. 18, 1996

[30] Foreign Application Priority Data

Oct. 18, 1995 [KR] Rep. of Korea ............ 95-35937

[51] Int. Cl.$^6$ ................................... G11C 11/34
[52] U.S. Cl. .................. 365/185.22; 365/185.24; 365/185.2
[58] Field of Search ............ 365/185.2, 185.21, 365/185.22, 185.24, 210

[56] References Cited

U.S. PATENT DOCUMENTS 5,361,227  11/1994  Tamaka et al. ............ 365/189.01
5,563,823  10/1996  Yiu et al. ............ 365/185.23 X Primary Examiner—Joseph A. Popek
Attorney, Agent, or Firm—Fish & Richardson P.C.

[57] ABSTRACT

The present invention relates to a flash memory device and more particularly to a flash memory device which can improve the performance of the memory cell due to the decrease in the verification time by performing the verification in parallel by selecting a plurality of addresses and then utilizing an integer multiple number of two or more of conventional verify modes at the time of verify mode.

3 Claims, 5 Drawing Sheets

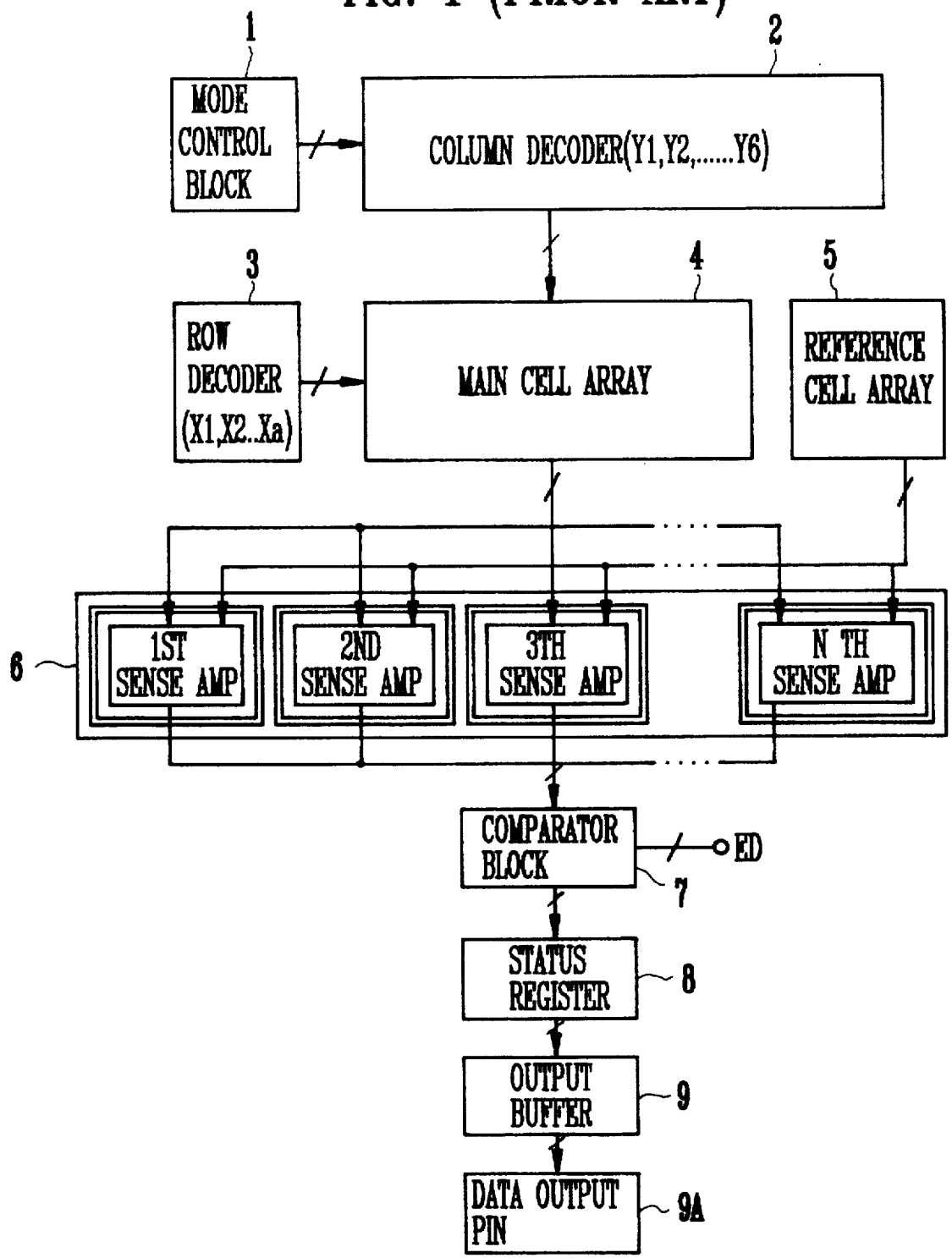

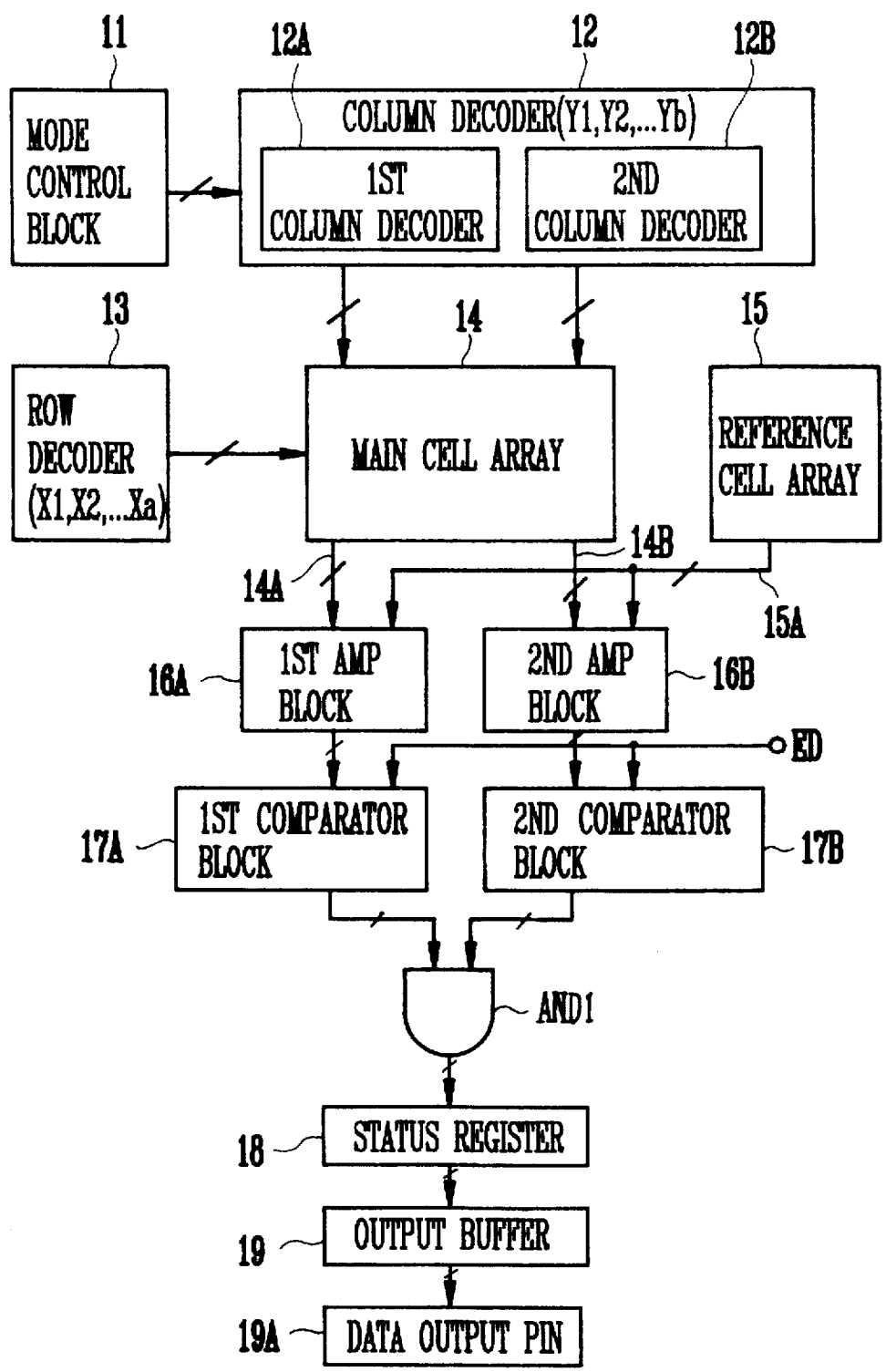

FLASH MEMORY DEVICE

BACKGROUND OF INVENTION

1. Field of the Invention

The present invention relates to a flash memory device and, more particularly, to a flash memory device which performs the verification in parallel by selecting a plurality of address and then utilizing an integer multiple number of two or more of conventional verify modes at the time of verify mode.

2. Information Disclosure Statement

The operation of a conventional flash memory device is described with reference to FIG. 1.

FIG. 1 is a block diagram illustrating the conventional flash memory device, wherein entering a verify mode by a mode control block 1, an address is selected by utilizing a method same as or different from a general read mode to select cells of a main cell array 4 by a column decoder 2 and a row decoder 3. However, the number of addresses selected at the time of read operation and verify operation is basically the same. The number of cells selected by the selected addresses is same as the number of data output pins. N data which are information stored in the selected N cells having the selected address values and N data which are output from a reference cell array 5 are sensed and amplified at a sense amplifierblock 6 composed of N sense amplifiers. N data amplified at the sense amplifier block 6 and a constant expected data ED are input to a comparator 7. The comparator 7 compares the two kinds of data and outputs a pass signal or a fail signal which correspond to whether the memory cells are normally programmed with the N data or erased. Then a status register 8 stores the pass or fail signal and outputs the signal through an output buffer 9 to a data output pin 9A. However, such conventional flash memory device has disadvantages in that the performance of the memory cell is degraded with use. As the storage data stored in the memory device is increased, the ratio of the verify time to the time for operation of each memory device is also continuously increased.

thus, to improve the performance of flash memory devices, it is desirable to decrease the processing time required in verification operations.

SUMMARY OF THE INVENTION

Therefore, the object of the present invention is to provide a flash memory device which can solve the above described disadvantages by having a decoding circuit which selects two or more addresses and an integer multiple number two or more of sense amplifier blocks and a corresponding number of comparator blocks to perform the verification in parallel at the time of verify mode. To accomplish the above described object, the present invention comprises: a mode control block to select a verify mode; a column decoder which takes the data of said mode control block as an input and is divided into first and second column decoders by treating as "don't care" any one of a plurality of input address pins; a main cell array taking as an input the address of said first and second column decoder and the address of row decoder; a first and second sense amplifier blocks which respectively take as inputs each column line of said main cell array selected by the address of said first and second column decoder and the address of said row decoder and a column line output from a reference cell array and which sense and amplify each input column line; first and second comparator blocks which take as input data amplified from each of said first and second sense amplifier block respectively and take as input a constant expected data and which compare the two kinds of input data to verify or pass/fail by the verification operation of entire cells; and a status register which stores a result value verified by said first and second comparator blocks and outputs the verified result value through an output buffer to data output pins.

BRIEF DESCRIPTION OF THE DRAWINGS

For fuller understanding of the nature and objects of the present invention, reference should be made to the following detailed description taken in conjunction with the accompanying drawings in which:

FIG. 1 is a block diagram to illustrate a conventional flash memory device;

FIG. 2 is a block diagram to illustrate a flash memory device according to the present invention.

Similar reference characters refer to similar parts in the several views of the drawings.

DETAILED DESCRIPTION OF THE INVENTION

Figure 3A:
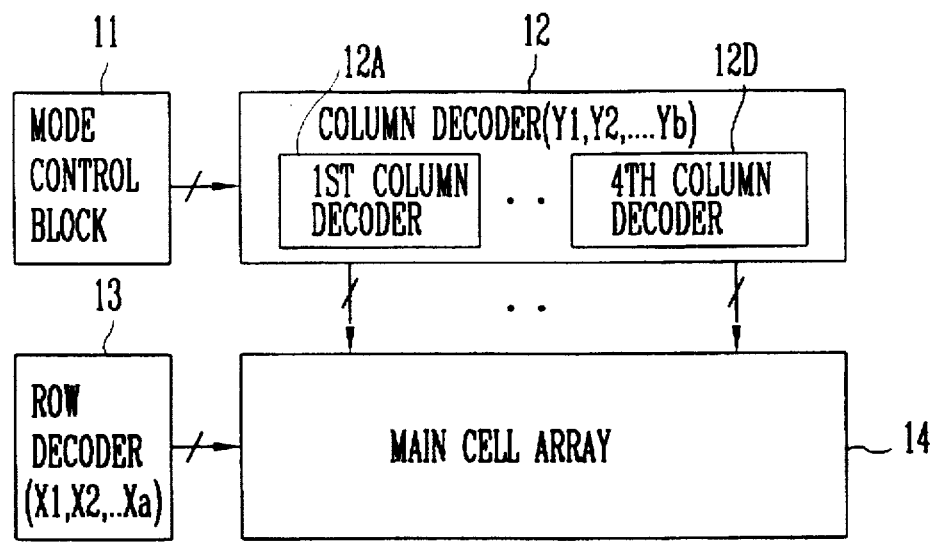
FIGS. 3A to 3D are block diagrams to illustrate other embodiments of the present invention.

A detailed description of the present invention will be given below with reference to the accompanying drawings.

FIG. 2 is a block diagram illustrating a flash memory device according to the present invention, where two addresses are selected by a decoding operation different from a general read mode by a mode control block 11. A column decoder 12 is divided into two conceptual blocks (that is, a first column decoder 12A and a second column decoder 12B) by treating as "don't care" any one of input address pins Y1, Y2, . . . .Yb of the column Two memory cells are selected by the first and second column decoders 12A and 12B, and a row decoder 13 having an address $X_1, X_2, \ldots X_a$. Information stored on each of the two memory cells is transferred to a first amplifier block 16A and a second amplifier block 16B through a first column line 14A and a second column line 14B, respectively. An output signal of a reference cell array 15 is transferred to the first amplifier block 16A and the second amplifier block 16B through a reference column line 15A. Each of the sense amplifier blocks 16A and 16B senses information stored on the two memory cells and outputs each resulting sense signal to a first comparator block 17A and a second comparator block 17B. A constant expected data ED is transferred to the first comparator block 17A and the second comparator block 17B. Each of comparator blocks 17A and 17B compares the sense signal with the constant expected data ED and outputs each resulting compare signal to an AND gate AND1. A pass or fail signal is generated by combining each compare signal using the AND gate AND1. The pass or fail signal is used to determine whether the two memory cells are normally programmed or erased. The pass or fail signal is stored on a status register 18 and then transferred to a data output pin 19A through an output buffer 19.

As described above, the number of selected addresses is determined according to the number of input address pins which are treated as "don't care" at the time of verify mode, and accordingly, the verification can be performed in parallel.

FIGS. 3A to 3D are other embodiments according to the present invention, the operation of which is described below.

FIG. 3A shows the number of addresses selected in a case where two of the input address pins of the column decoder 12 are treated as "don't care". The number of addresses selected by the verify operation becomes $2^2$ by the verify operation of FIG. 2. The column decoder 12 is divided into four conceptual blocks, that is, a first column decoder 12A through a fourth column decoder 12D. Hence, four memory cells of the main cell array are selected by the first through fourth column decoders and the row decoder 13.

Figure 3B:
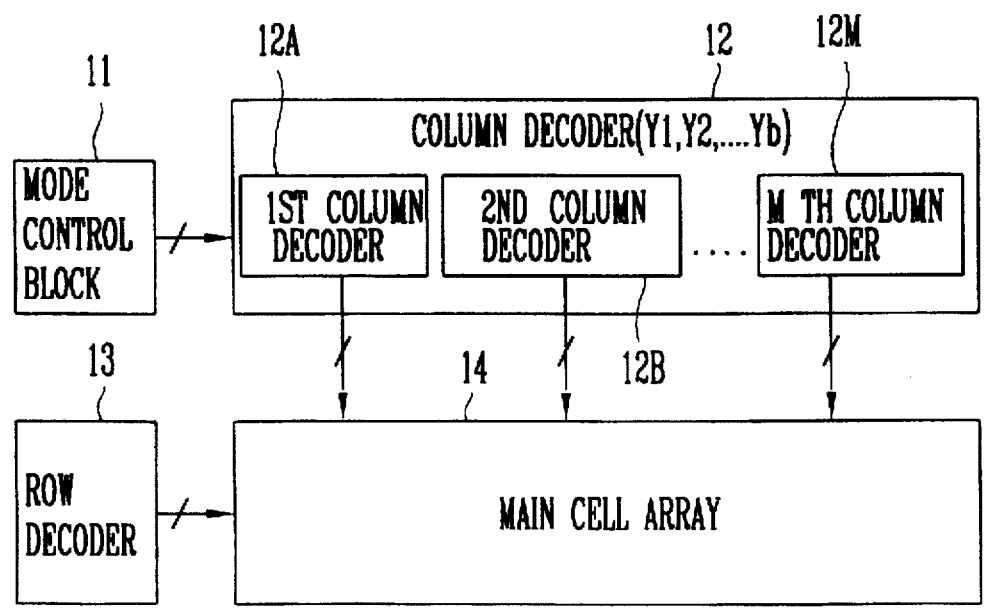
Figure 3C:
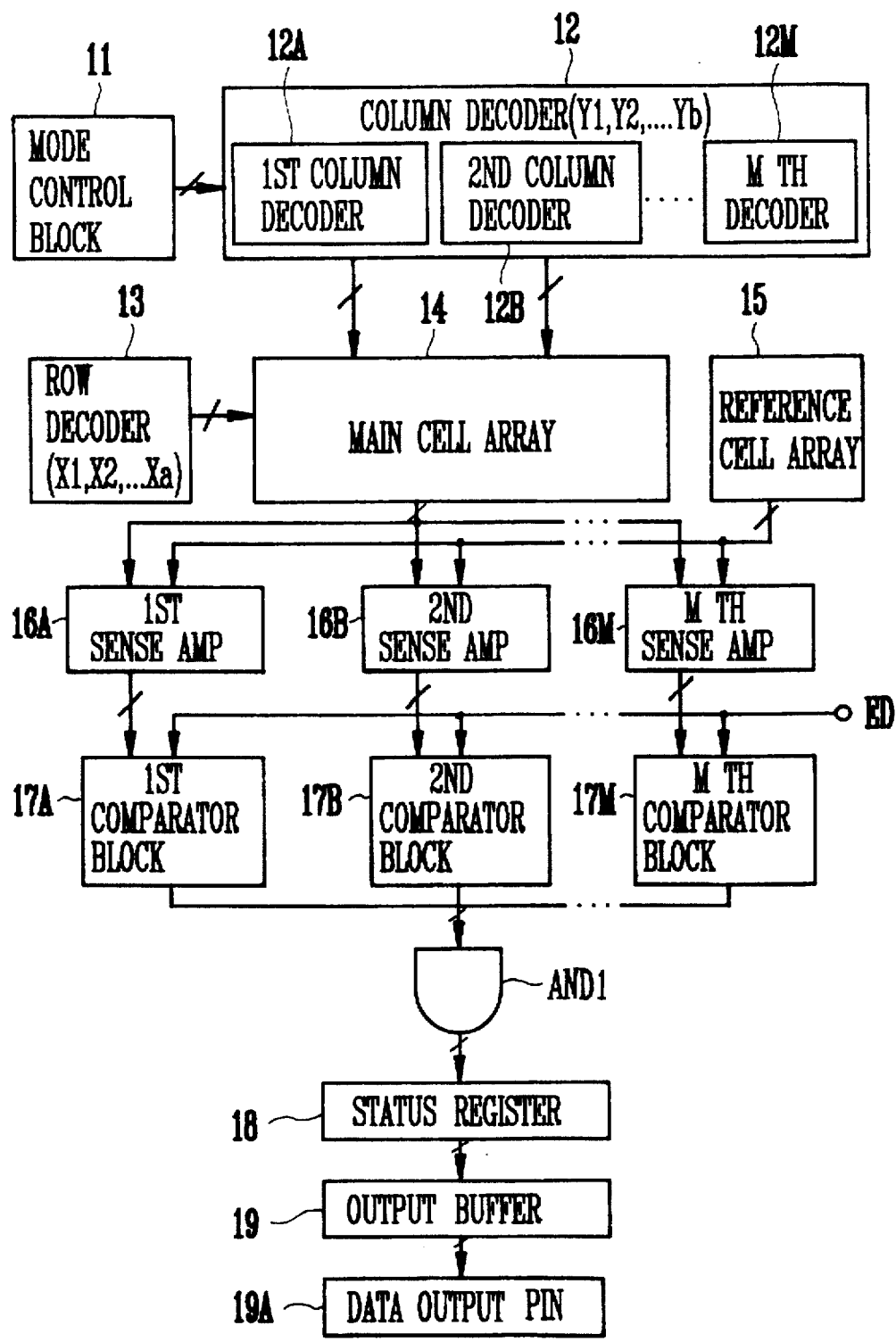

FIG. 3B shows the number of addresses selected in case where M of the input address pins of the column decoder 12 are treated as "don't care" and FIG. 3C shows the verify operation of FIG. 3B. The number of addresses selected by the verify operation becomes $2^M$ by the verify operation of FIG. 3C. Further, the number of selected cells becomes $N \times 2^M$ in which N is the number of output of a flash memory device and M is the number of input address treated as "don't care". That is, to verify t the selected cells, the sense amplifier blocks amplify the information memorized in the cells as many times as the number of selected addresses, and the comparator blocks which are the same number as that of the selected addresses compare the information with the expected data to verify pass or fail of each cell.

Figure 3D:
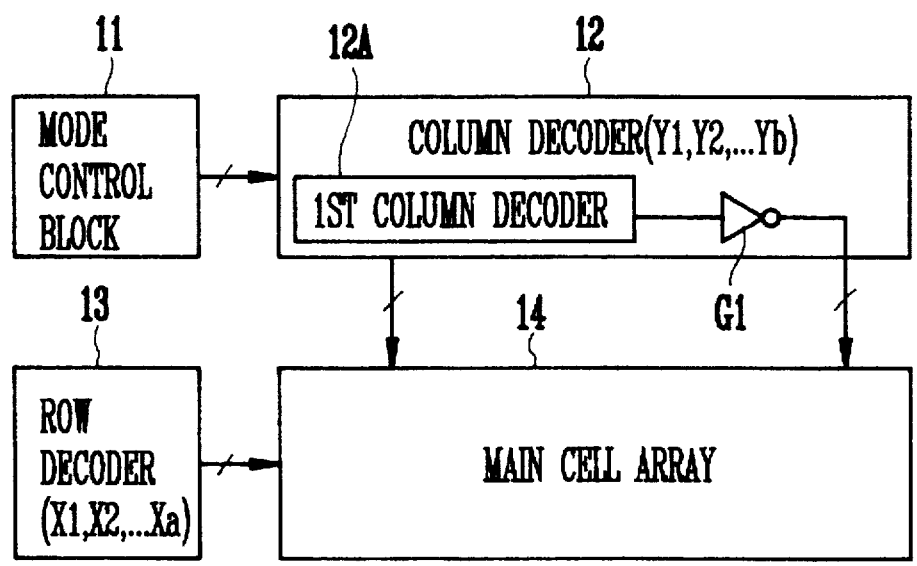

In FIG. 3D, to perform the verification twice in succession during the same time as the conventional verification time, the address is selected in the same way as the conventional column decoding method, and at the same time the address having the values obtained when the selected address is reversed via an inverter G1 is selected so that the verify mode is performed in parallel.

As described above, according to the present invention, the verification time is reduced at the time of verify mode by performing the verification in parallel by selecting a plurality of addresses and then utilizing an integer multiple number of two or more of conventional verify modes at the time of verify mode. That is, in case where two addresses are concurrently selected, the verification time is reduced to ½ of conventional verification time, and in case where four addresses are concurrently selected, the verification time is reduced to ¼ of conventional verification time. As described above, there is an excellent effect on the improvement of performance of the memory cell due to the decrease in verification time.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A flash memory device comprising:

a mode control block to select a verify mode;

a column decoder coupled to said mode control block and divided into first and second column decoders by treating as "don't care" one of a plurality of input address pins;

a main cell array to which an address of said first and second column decoders and an address of a row decoder are input;

first and second sense amplifier blocks to which information from each column line of said main cell array selected by the address of said row decoder and an output signal of a reference cell array are input, respectively, wherein said first and second sense amplifier blocks operate to sense and amplify the information to produce a sense signal indicative thereof;

first and second comparator blocks to which each sense signal from said first and second sense amplifier blocks and a constant expected data are input, wherein each of first and second comparator blocks compares the sense signal with the constant expected data and each outputs a compare signal indicative thereof;

means for generating a pass or fail signal to determine whether said main cell array is normally programmed or erased according to each compare signal;

a status register to store the pass or fail signal; and an output buffer to output the pass or fail signal from said status register to a data output node.

2. The flash memory device of claim 1, wherein the device is further constructed to perform the verify mode in parallel by selecting an address having a value which is obtained when the selected address is reversed via an inverter to perform the verification twice in succession during the same time as the conventional verification time in said column decoder.

3. A flash memory device comprising:

a mode control block to select a verify mode;

a column decoder which is divided into a plurality of column decoders by treating as "don't care" one or more addresses of input addresses;

a main cell array to which an address of said column decoders and an address of a row decoder are input;

a plurality of sense amplifier blocks to which information stored on memory cells selected by said column decoder and said row decoder using an output signal of a reference cell array; and means for generating a pass or fail signal to determine whether said main cell array is normally programmed or erased by comparing each output signal using a plurality of comparator blocks of said sense amplifier with a constant expected data and then combining each compare signal from said comparator blocks.

* * * * *